(12) United States Patent
Brown et al.

(10) Patent No.: US 11,705,389 B2
(45) Date of Patent: Jul. 18, 2023

(54) VIAS FOR PACKAGE SUBSTRATES

(71) Applicant: Intel Corporation, Santa Clara, CA (US)

(72) Inventors: Andrew J. Brown, Gilbert, AZ (US); Luke Garner, Chandler, AZ (US); Liwei Cheng, Chandler, AZ (US); Lauren Link, Mesa, AZ (US); Cheng Xu, Chandler, AZ (US); Ying Wang, Chandler, AZ (US); Bin Zou, Chandler, AZ (US); Chong Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 887 days.

(21) Appl. No.: 16/437,420

(22) Filed: Jun. 11, 2019

(65) Prior Publication Data

US 2020/0395282 A1 Dec. 17, 2020

(51) Int. Cl.

| H01L 23/48 | (2006.01) |
|---|---|
| H01L 23/52 | (2006.01) |
| H01L 23/498 | (2006.01) |
| H01L 21/48 | (2006.01) |

(52) U.S. Cl.
CPC ...... *H01L 23/49827* (2013.01); *H01L 21/486* (2013.01); *H01L 23/49894* (2013.01)

(58) Field of Classification Search
CPC ............. H01L 23/49827; H01L 21/486; H01L 23/49894; H01L 23/145
USPC ........................................................ 257/668
See application file for complete search history.

(56) References Cited

U.S. PATENT DOCUMENTS

| 2013/0119555 A1* | 5/2013 | Sundaram | ............... H01L 23/15 257/774 |
|---|---|---|---|
| 2016/0086894 A1* | 3/2016 | Rorane | ................. H01L 23/562 257/734 |

* cited by examiner

*Primary Examiner* — Theresa T Doan
(74) *Attorney, Agent, or Firm* — Schwabe, Williamson & Wyatt, P.C.

(57) ABSTRACT

Embodiments herein describe techniques for a semiconductor device including a package substrate. The package substrate includes a via pad at least partially in a core layer. A first dielectric layer having a first dielectric material is above the via pad and the core layer, where the first dielectric layer has a first through hole that is through the first dielectric layer to reach the via pad. A second dielectric layer having a second dielectric material is at least partially filling the first through hole, where the second dielectric layer has a second through hole that is through the second dielectric layer to reach the via pad. A via is further within the second through hole of the second dielectric layer, surrounded by the second dielectric material, and in contact with the via pad. Other embodiments may be described and/or claimed.

24 Claims, 7 Drawing Sheets

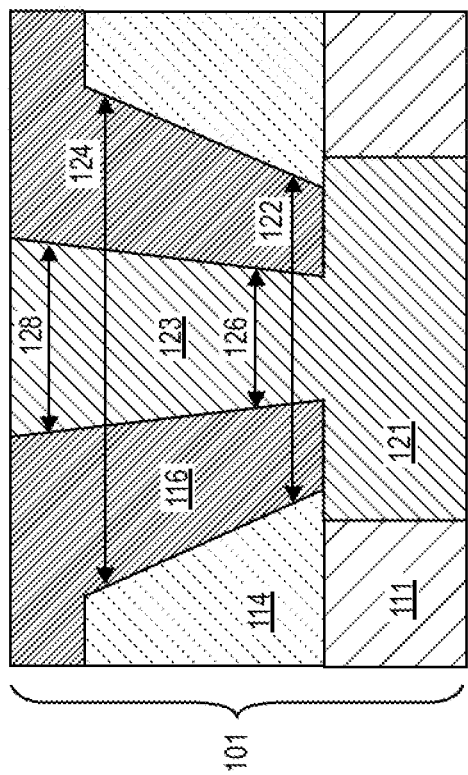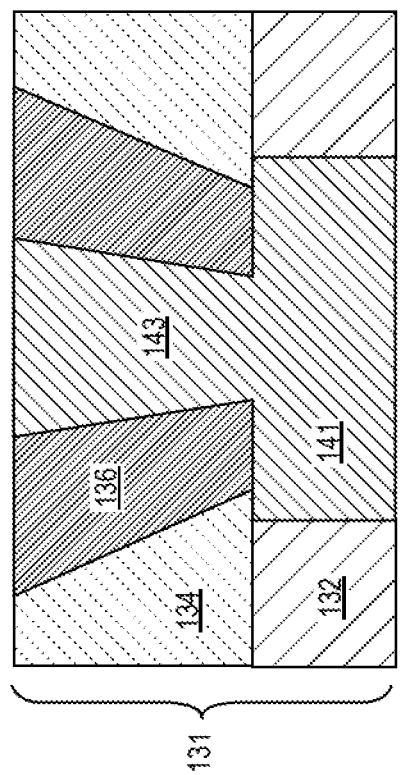
Figure 1(b)  Figure 1(c)
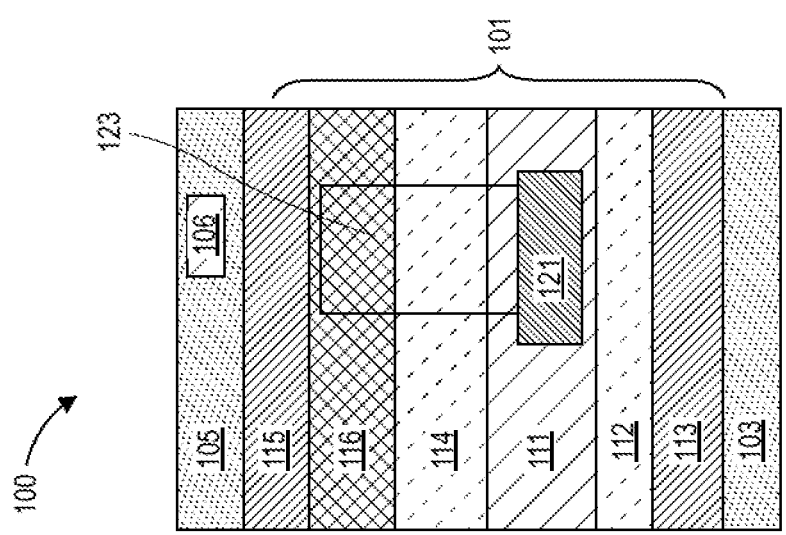
Figure 1(a)

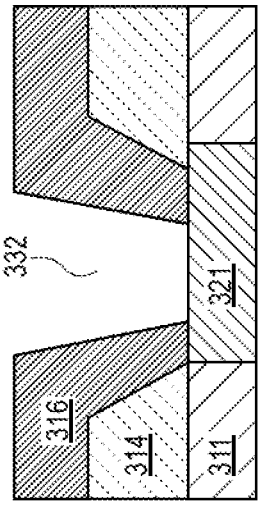
Figure 3(d)
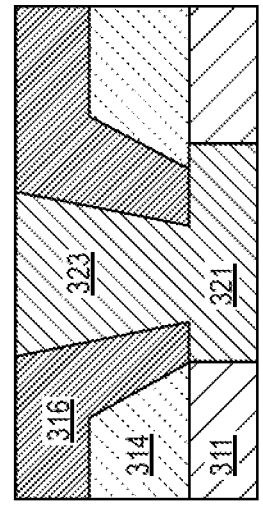
Figure 3(e)
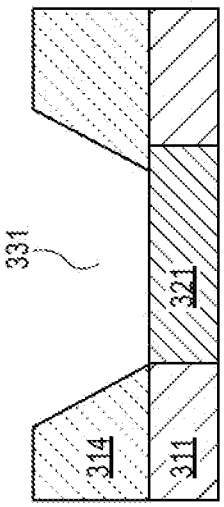
Figure 3(a)
Figure 3(b)
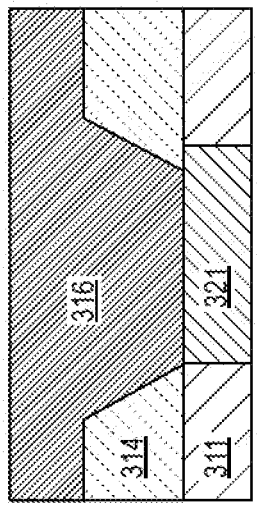
Figure 3(c)

VIAS FOR PACKAGE SUBSTRATES

FIELD

Embodiments of the present disclosure generally relate to the field of integrated circuits, and more particularly, to vias for package substrates.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Integrated circuit (IC) packages are used in consumer electronics and mobile communications devices that play an essential role in current everyday life. Various packing technologies, e.g., stacked IC packages, complex system-in-packages (SiPs), flip chip interconnection and through-silicon vias, and package substrates, have been developed. However, current packing technology may face challenges for high reliability systems. For example, IC packages used in Advanced Driver Assistance Systems (ADAS) may often have conductive anodic filament (CAF) failures. Improvements for packaging technology is desired.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 1(a)-1(e) schematically illustrate example package substrates including vias, in accordance with various embodiments.

FIGS. 3(a)-3(e) illustrate a process for forming a package substrate including a via, in accordance with various embodiments.

DETAILED DESCRIPTION

Figure 1E:
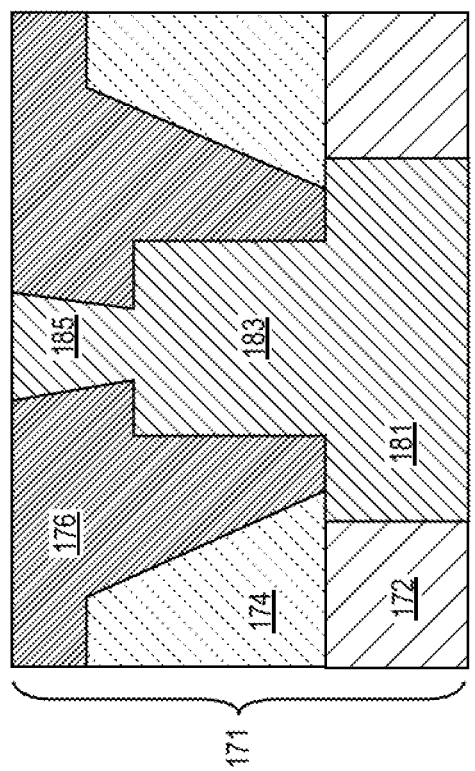

An integrated circuit (IC) package may include a semiconductor die placed on a package substrate, which may be further placed on a printed circuit board (PCB). High reliability systems, e.g., Advanced Driver Assistance Systems (ADAS), may require IC packages used in such systems capable of exceeding 3000 cycles of temperature cycling, according to Automotive Electronics Council (AEC)-Q100 standards. Normal packaging materials may have high warpage and package stresses during temperature cycling for such a high reliability system. Previously, some glass-cloth dielectrics materials have been used in package substrates with some improved performance for high reliability systems. However, package substrates based on glass-cloth dielectrics may have conductive anodic filament (CAF) failure problems. When CAF failure happens, copper ions may migrate between Cu features, e.g., vias, of opposite polarity along a glass fiber, due to cracks, moisture, voltage application to the package, or other reasons. The potential CAF failures in IC packages may increase the risk for leakage, and place constraints on the feature sizes within the package substrate. For example, via pitches may have to be large enough, e.g., larger than 150 um or 183 um, to reduce the potential CAF failures. Other materials used in package substrates, e.g., prepreg materials, low coefficient of thermal expansion (CTE) build-up materials, have their own challenges too. For example, the prepreg materials may need a complicated fabrication process, while low CTE build-up materials, e.g., having room temperature CTE of 16 and high temperature CTE of 10, may have low modulus leading to low reliability for the packages.

While currently available package substrates have failed to meet the design rules for high reliability systems, e.g., ADAS systems, embodiments herein may present a package substrate architecture and process flow for forming vias that can be tightly spaced to meet the design rules. Embodiments herein may first have a larger hole, e.g., drilled by laser, in a glass-cloth material (GCM), followed by filling the larger hole with a second dielectric material, e.g., a conventional build-up (BU) resin. Subsequently, a smaller via is drilled inside the filled hole, such that only the conventional BU resin is exposed in the resulting smaller hole. As a result, the Cu-plated via will be surrounded by BU resin, thereby encapsulating the glass cloth material to protect against CAF failures. Accordingly, embodiments herein may have via-via pitch reduced down to ~107 um to meet the design rules for ADAS products. In addition, embodiments herein may be fabricated using currently available tools and existing packaging substrate processes.

Embodiments herein may present an apparatus of package substrate. The package substrate includes a via pad at least partially in a core layer. A first dielectric layer having a first dielectric material is above the via pad and the core layer, where the first dielectric layer has a first through hole that is through the first dielectric layer to reach the via pad. A second dielectric layer having a second dielectric material is at least partially filling the first through hole, where the second dielectric layer has a second through hole that is through the second dielectric layer to reach the via pad. A via is further within the second through hole of the second dielectric layer, surrounded by the second dielectric material, and in contact with the via pad.

In embodiments, a method for forming a semiconductor device is presented. The method includes forming a via pad at least partially in a core layer. In addition, the method includes forming a first dielectric layer having a first dielectric material above the via pad and the core layer, and forming a first through hole that is through the first dielectric layer to reach the via pad. Afterwards, the method includes forming a second dielectric layer having a second dielectric material at least partially filling the first through hole, and forming a second through hole that is through the second dielectric layer to reach the via pad. Moreover, the method includes forming a via within the second through hole of the second dielectric layer, surrounded by the second dielectric material, and in contact with the via pad.

Embodiments herein may present a computing device, which may include a print circuit board (PCB), a semiconductor die, and a package substrate between the semiconductor die and the PCB. The package substrate includes a via pad at least partially in a core layer. A first dielectric layer having a first dielectric material is above the via pad and the core layer, where the first dielectric layer has a first through hole that is through the first dielectric layer to reach the via pad. A second dielectric layer having a second dielectric material is at least partially filling the first through hole, where the second dielectric layer has a second through hole that is through the second dielectric layer to reach the via pad. A via is further within the second through hole of the second dielectric layer, surrounded by the second dielectric material, and in contact with the via pad.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, zinc oxide or other combinations of group III-V, II-VI, group IV, or semiconducting oxide materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIGS. 1(a)-1(e) schematically illustrate example package substrates including vias, in accordance with various embodiments. FIG. 1(a) shows a semiconductor die 105 placed on a package substrate 101, which may be further placed on a PCB 103, where the package substrate 101 includes a via 123 within the package substrate 101. FIGS. 1(b)-1(e) illustrate more details of a via 123 within a package substrate 101, a via 143 within a package substrate 131, a via 163 within a package substrate 151, or a via including a first via portion 183 and a second via portion 185 within a package substrate 171.

In embodiments, as shown in FIG. 1(a), a semiconductor device 100 includes the semiconductor die 105. The semiconductor die 105 may include various active devices or passive devices, e.g., a transistor 106. Furthermore, the semiconductor device 100 includes the PCB 103, and the package substrate 101. The via 123 may be embedded within the package substrate 101, in contact with a via pad 121. There may be various layers in the package substrate 101. For example, there may be a core layer 111, a dielectric layer 112 below the core layer 111, a dielectric layer 114 or a dielectric layer 116 above the core layer 111, a solder resist layer 113 and a solder resist layer 115 below and above the core layer 111 respectively. There may be other layers, e.g., conductive layers, within the package substrate 101, not shown.

In embodiments, the semiconductor device 100 may be part of a wearable device or a mobile computing device. In addition, not shown, the wearable device or the mobile computing device may include one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

In embodiments, as shown in FIG. 1(b), the via 123 is embedded within the package substrate 101. The package substrate 101 includes the core layer 111, and the dielectric layer 114 above the core layer 111. The via pad 121 is at least partially located in the core layer 111, and in contact with the via 123. The dielectric layer 114 includes a first dielectric material above the via pad 121 and the core layer 111. The dielectric layer 114 has a first through hole that is through the dielectric layer 114 to reach the via pad 121. The first through hole has a bottom opening 122 that is smaller width than a top opening 124, which may be caused by laser drilling in forming the first through hole. A dielectric layer 116 has a second dielectric material and at least partially fills the first through hole of the dielectric layer 114. In addition, the dielectric layer 116 has a second through hole that is through the dielectric layer 116 to reach the via pad 121. The second through hole has a bottom opening 126 that is smaller width than a top opening 128, which may be caused by laser drilling in forming the second through hole. A portion of the dielectric layer 116 is above the dielectric layer 114.

In embodiments, the core layer 111 may include organic resin, inorganic filler, or a conductive material. The first dielectric material in the dielectric layer 114 includes a glass-cloth material (GCM) impregnated within a dielectric material. The GCM may have a CTE in a range of about 8 to about 18. For example, the first dielectric material in the dielectric layer 114 may include a glass material, a resin material, and a filler material. In addition, the second dielectric material in the dielectric layer 116 may include the resin material that is included in the first dielectric material. In some embodiments, the resin material included in the first dielectric material and the second dielectric material may be a build up (BU) resin material. For example, the resin material may include FR-4-epoxy, polyfunctional FR-4, high temperature one component epoxy system, bismaleimide trizaine epoxy (BT), polyimide epoxy, cyanate ester (CE), polyimide, phenol hardener, phenolic ester hardener, or polyimide and polytetrafluoroethylene (PTFE). Moreover, the glass material in the first dielectric material in the dielectric layer 114 may include a non-woven glass material, a woven glass material, a fiber glass material, or a filled glass material. Furthermore, the filler material in the first dielectric material in the dielectric layer 114 may include silicon dioxide, aluminum oxide, calcium oxide, magnesium oxide, boron trioxide, iron(iii) oxide, or zirconium oxide.

In embodiments, the via 123 is within the second through hole of the dielectric layer 116, surrounded by the second dielectric material, and in contact with the via pad 121. Accordingly, the via 123 is not in contact with the dielectric layer 114. As a consequence, the via 123 may only be surrounded by a conventional BU resin within the second through hole of the dielectric layer 116, without in contact with the GCM impregnated within the dielectric material in the dielectric layer 114 to protect against CAF failures.

In embodiments, the via pad 121 and the via 123 may include a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO. In addition, the via pad 121 may have a width of about 50 um to 150 um, the via 123 may have a width of about 10 um to about 100 um, and the dielectric layer 114 may have a thickness of about 10 um to 50 um.

The via 123 shown in FIG. 1(b) may be one example. There may be many other different designs for such vias embedded within a package substrate. In embodiments, as shown in FIG. 1(c), the via 143 is embedded within the package substrate 131. The package substrate 131 includes a core layer 132, and a dielectric layer 134 above the core layer 132. A via pad 141 is at least partially located in the core layer 132, and in contact with the via 143. The dielectric layer 134 includes a first dielectric material above the via pad 141 and the core layer 132. The dielectric layer 134 has a first through hole that is through the dielectric layer 134 to reach the via pad 141. The first through hole has a bottom opening that is smaller width than a top opening, which may be caused by laser drilling in forming the first through hole. A dielectric layer 136 has a second dielectric material and at least partially fills the first through hole of the dielectric layer 134. In addition, the dielectric layer 136 has a second through hole that is through the dielectric layer 136 to reach the via pad 141. The second through hole has a bottom opening that is smaller width than a top opening, which may be caused by laser drilling in forming the second through hole. The dielectric layer 136 is coplanar with the dielectric layer 134.

Figure 1D:
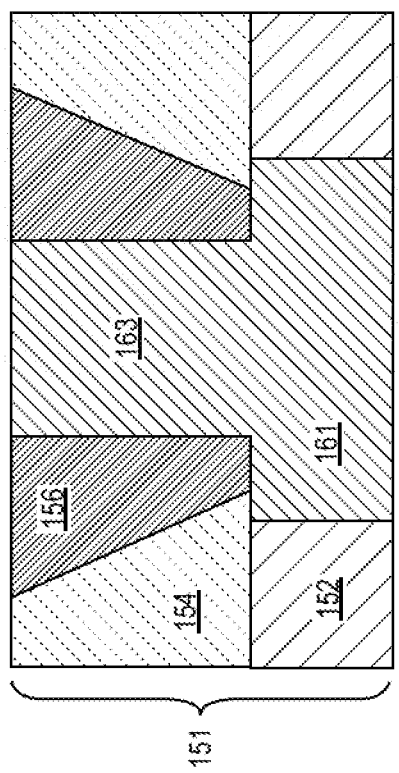

In embodiments, as shown in FIG. 1(d), the via 163 is embedded within the package substrate 151. The package substrate 151 includes a core layer 152, and a dielectric layer 154 above the core layer 152. A via pad 161 is at least partially located in the core layer 152, and in contact with the via 163. The dielectric layer 154 includes a first dielectric material above the via pad 161 and the core layer 152. The dielectric layer 154 has a first through hole that is through the dielectric layer 154 to reach the via pad 161. The first through hole has a bottom opening that is smaller width than a top opening, which may be caused by laser drilling in forming the first through hole. A dielectric layer 156 has a second dielectric material and at least partially fills the first through hole of the dielectric layer 154. In addition, the dielectric layer 156 has a second through hole that is through the dielectric layer 156 to reach the via pad 161. The second through hole has a rectangular cross section with a bottom opening substantially same as a top opening. The dielectric layer 156 is coplanar with the dielectric layer 154.

In embodiments, as shown in FIG. 1(e), the via embedded within the package substrate 171 has a first via portion 183 and a second via portion 185 within a dielectric layer 176, the first via portion 183 is of a first shape, and the second via portion 185 is of a second shape different from the first shape. For example, the first via portion 183 is a rectangular shape in cross section, while the second via portion 185 is of a quadrilateral shape. The package substrate 171 includes a core layer 172, and a dielectric layer 174 above the core layer 172. A via pad 181 is at least partially located in the core layer 172, and in contact with the first via portion 183. The dielectric layer 174 includes a first dielectric material above the via pad 181 and the core layer 172. The dielectric layer 174 has a first through hole that is through the dielectric layer 174 to reach the via pad 181. The first through hole has a bottom opening that is smaller width than a top opening, which may be caused by laser drilling in forming the first through hole. The dielectric layer 176 has a second dielectric material and at least partially fills the first through hole of the dielectric layer 174. In addition, the dielectric layer 176 has a second through hole that is through the dielectric layer 176 to reach the via pad 181. The second through hole has a bottom opening that is smaller width than a top opening, which may be caused by laser drilling in forming the second through hole. The via having the first via portion 183 and the second via portion 185 is within the second through hole.

Figure 2:
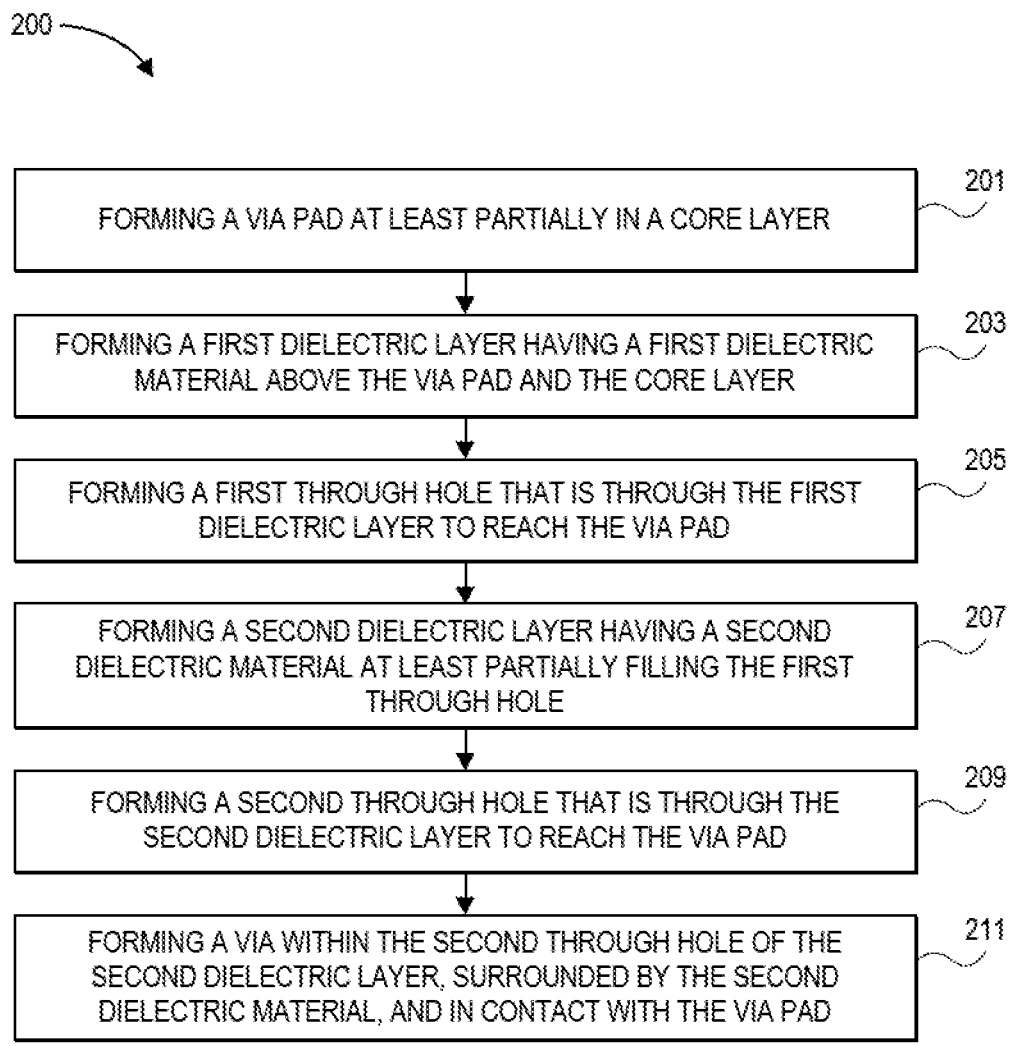
FIG. 2 illustrates a diagram of a process for forming a package substrate including a via, in accordance with various embodiments.
Figure 4D:
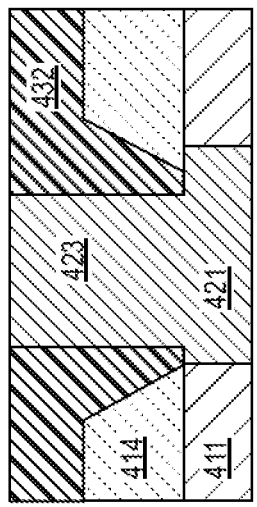
FIGS. 4(a)-4(e) illustrate a process for forming a package substrate including a via, in accordance with various embodiments.
Figure 4E:
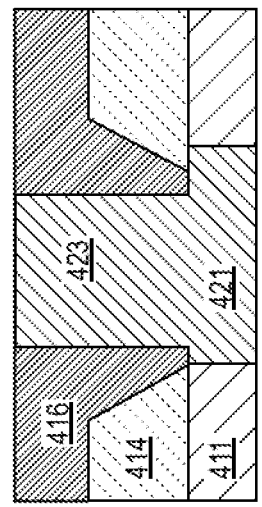
Figure 4A:
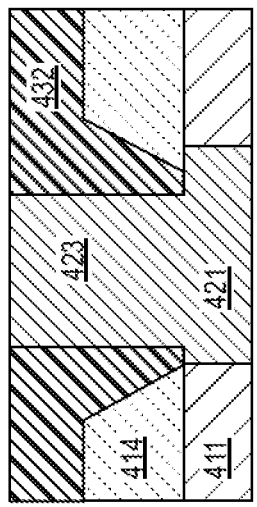
Figure 4B:
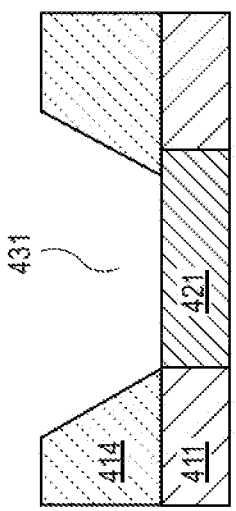
Figure 4C:
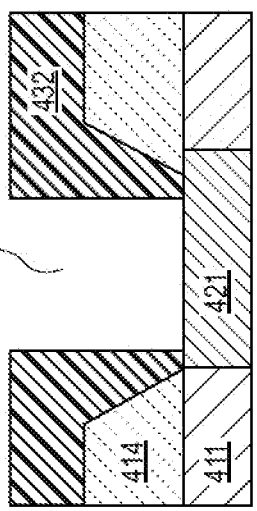

FIG. 2 illustrates a diagram of a process 200 for forming a package substrate including a via, in accordance with various embodiments. In embodiments, the process 200 may be applied to form a via similar to the via 123, the via 143, the via 163, and the via including the first via portion 183 and the second via portion 185, as shown in FIGS. 1(*b*)-1(*e*). FIGS. 3(*a*)-3(*e*) and FIGS. 4(*a*)-4(*d*) illustrate the process 200 in more details.

At block 201, the process 200 may include forming a via pad at least partially in a core layer. For example, as shown in FIG. 3(*a*), the process 200 may include forming a via pad 321 at least partially in a core layer 311. As shown in FIG. 4(*a*), the process 200 may include forming a via pad 421 at least partially in a core layer 411. The via pad 321 or the via pad 421 may have a width of about 50 um to 150 um, and a thickness of about 10 um to 20 um.

At block 203, the process 200 may include forming a first dielectric layer having a first dielectric material above the via pad and the core layer. For example, as shown in FIG. 3(*a*), the process 200 may include forming a first dielectric layer 314 having a first dielectric material above the via pad 321 and the core layer 311. As shown in FIG. 4(*a*), the process 200 may include forming a first dielectric layer 414 having a first dielectric material above the via pad 421 and the core layer 411. The first dielectric layer 314 or the first dielectric layer 414 may have a thickness around 20 um to 25 um. For some other embodiments, the first dielectric layer 314 or the first dielectric layer 414 may have a thickness of about 10 um to 50 um.

At block 205, the process 200 may include forming a first through hole that is through the first dielectric layer to reach the via pad. For example, as shown in FIG. 3(*b*), the process 200 may include forming a first through hole 331 that is through the first dielectric layer 314 to reach the via pad 321. Additionally and alternatively, as shown in FIG. 4(*b*), the process 200 may forming a first through hole 431 that is through the first dielectric layer 414 to reach the via pad 421. In some embodiments, the first through hole 331 or the first through hole 431 may be made by laser drill, and have a top opening around 65 um-70 um width, and a bottom opening around 50 um-65 um.

At block 207, the process 200 may include forming a second dielectric layer having a second dielectric material at least partially filling the first through hole. For example, as shown in FIG. 3(*c*), the process 200 may include forming a second dielectric layer 316 having a second dielectric material at least partially filling the first through hole 331. In FIG. 3(*c*), the second dielectric layer 316 completely fills the first through hole 331 and a portion of the second dielectric layer 316 is above the first dielectric layer 314. The portion of the second dielectric layer 316 above the first dielectric layer 314 may have a thickness around 5 um to 15 um. In some other embodiments, the second dielectric layer 316 may be coplanar with the first dielectric layer 314, or partially fill the first through hole 331.

At block 209, the process 200 may include forming a second through hole that is through the second dielectric layer to reach the via pad. For example, as shown in FIG. 3(*d*), the process 200 may include forming a second through hole 332 that is through the second dielectric layer 316 to reach the via pad 321. The second through hole 332 may be made by laser drill, and may have a top opening around 40 um-50 um width, and a bottom opening around 30 um-45 um.

Additionally and alternatively, as shown in FIG. 4(*c*), a dry film resist layer (DFR) 432 may be formed to partially fill the first through hole 431. The DFR may have a portion above the first dielectric layer 414, and leave a narrow opening in a rectangular shape. The narrowed first through hole 431 may keep the via pad 421 visible.

At block 211, the process 200 may include forming a via within the second through hole of the second dielectric layer, surrounded by the second dielectric material, and in contact with the via pad. For example, as shown in FIG. 3(*e*), the process 200 may include forming a via 323 within the second through hole 332 of the second dielectric layer 316, surrounded by the second dielectric material, and in contact with the via pad 321.

Additionally and alternatively, as shown in FIG. 4(*d*), the process 200 may include forming a via 423 within the narrowed first through hole 431 of the first dielectric layer 414, separated from the first dielectric layer 414 by the DFR 432. Afterwards, as shown in FIG. 4(*e*), the DFR may be removed, e.g., by etching or flash etching. A second dielectric layer 416 having a second dielectric material, e.g., a BU material, may fill the gap formed after removing the DFR 432. Additional operations may be performed. For example, the BU material may cover the via 423, and grinding of the BU material may be performed to remove the BU material to reveal the via 423. The use of DFR and lithography techniques may be used to form the via 423, which may have a better control over the size and shape of the via 423. In some embodiments, the via 423 may have a width of about 10 um to about 100 um, and may be of a rectangular shape.

Multiple vias and via pads may be formed in a package substrate following the process 200. In some embodiments, vias and via pads formed following the process 200 may have via-via pitch reduction down to ~107 um, a pad-to-pad spacing of 12 um, via-to-pad alignment variation may be around 14 um, and the laser accuracy and via size variation may be about 13 um.

Figure 5:
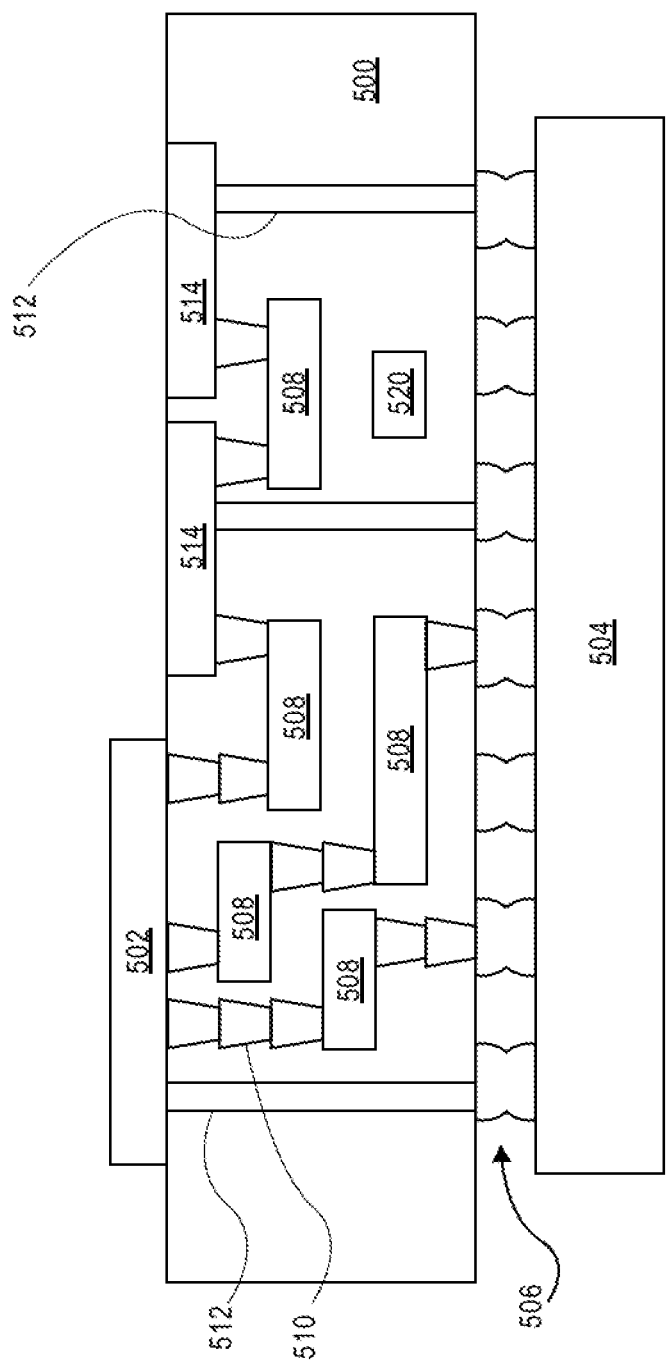
FIG. 5 schematically illustrates a package substrate implementing one or more embodiments of the disclosure, in accordance with various embodiments.

FIG. 5 schematically illustrates a package substrate 500 implementing one or more embodiments of the disclosure, in accordance with some embodiments. The package substrate 500 is an intervening substrate used to bridge a first substrate 502 to a second substrate 504. The first substrate 502 may be, for instance, a substrate support for a die. The second substrate 504 may be, for instance, a memory module, a computer motherboard, or a PCB. For example, a package substrate 500 may couple an integrated circuit die to a ball grid array (BGA) 506 that can subsequently be coupled to the second substrate 504. In some embodiments, the first and second substrates 502/504 are attached to opposing sides of the package substrate 500. In other embodiments, the first and second substrates 502/504 are attached to the same side of the package substrate 500. And in further embodiments, three or more substrates are interconnected by way of the package substrate 500.

The package substrate 500 may be formed of an epoxy resin, a fiberglass-reinforced epoxy resin, a ceramic material, or a polymer material such as polyimide. In further implementations, the package substrate may be formed of alternate rigid or flexible materials that may include the same materials described above for use in a semiconductor substrate, such as silicon, germanium, and other group III-V and group IV materials.

The package substrate may include metal interconnects 508 and vias 510, including but not limited to through-silicon vias (TSVs) 512. The package substrate 500 may further include embedded devices 514, including both passive and active devices, e.g., a via 520. The via 520 may be similar to the via 123, the via 143, the via 163, and the via including the first via portion 183 and the second via portion 185, as shown in FIGS. 1(b)-1(e), the via 323 shown in FIG. 3(e), and the via 423 shown in FIG. 4(e). Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the package substrate 500.

In accordance with embodiments of the disclosure, apparatuses or processes disclosed herein may be used in the fabrication of package substrate 500.

Figure 6:
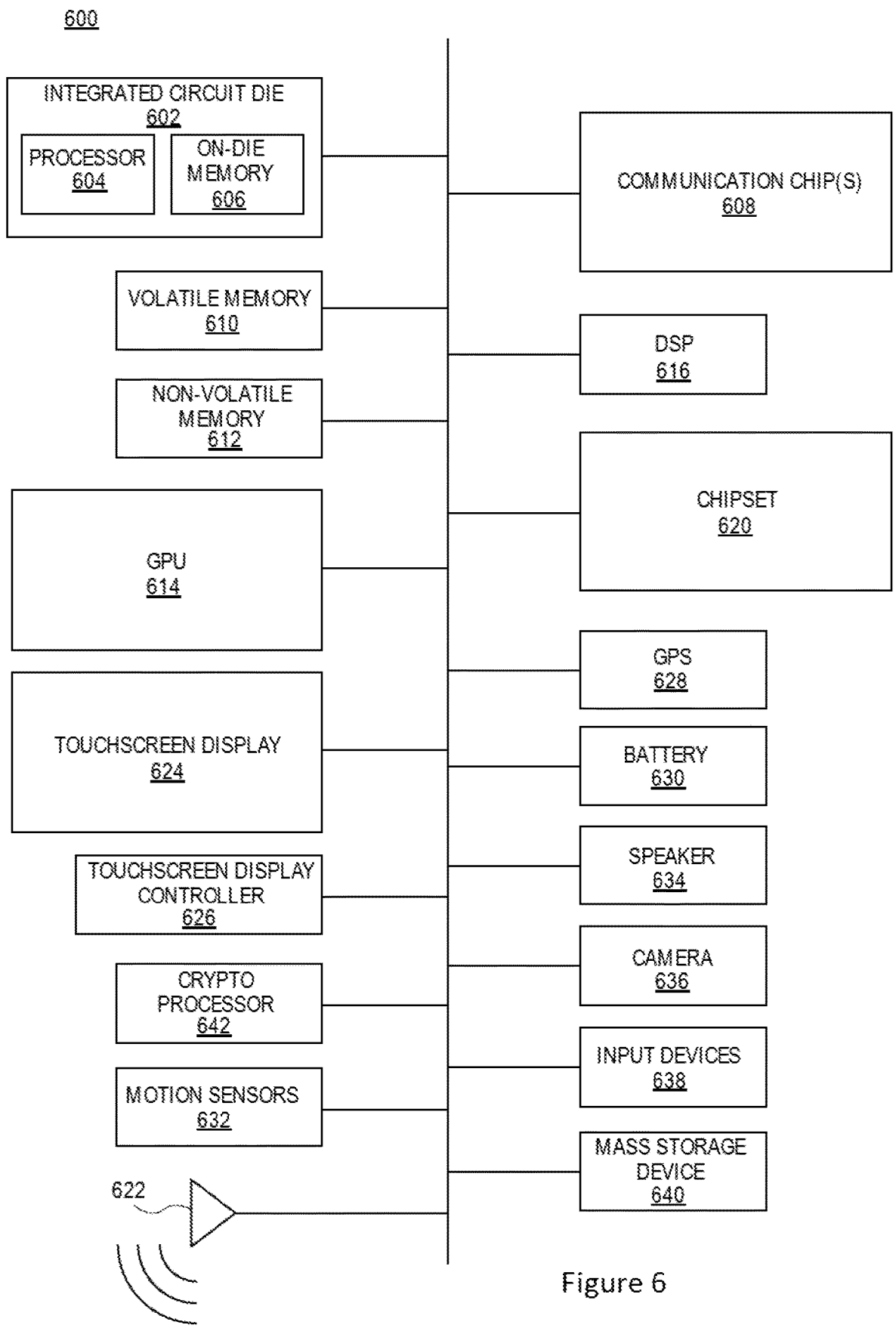
FIG. 6 schematically illustrates a computing device built in accordance with an embodiment of the disclosure, in accordance with various embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606, the processor 604, or the integrated circuit die 602 may be placed on a packaging substrate that includes a via, e.g., the via 123, the via 143, the via 163, and the via including the first via portion 183 and the second via portion 185, as shown in FIGS. 1(b)-1(e), the via 323 shown in FIG. 3(e), and the via 423 shown in FIG. 4(e). In embodiments, the computing device 600 may include a display or a touchscreen display 624, and a touchscreen display controller 626. A display or the touchscreen display 624 may include a FPD, an AMOLED display, a TFT LCD, a micro light-emitting diode (μLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure. In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 may include an apparatus of package substrate, comprising: a via pad at least partially in a core layer; a first dielectric layer having a first dielectric material above the via pad and the core layer, wherein the first dielectric layer has a first through hole that is through the first dielectric layer to reach the via pad; a second dielectric layer having a second dielectric material at least partially filling the first through hole, wherein the second dielectric layer has a second through hole that is through the second dielectric layer to reach the via pad; and a via within the second through hole of the second dielectric layer, surrounded by the second dielectric material, and in contact with the via pad.

Example 2 may include the apparatus of example 1 and/or some other examples herein, wherein the first through hole has a bottom opening that is smaller width than a top opening.

Example 3 may include the apparatus of example 1 and/or some other examples herein, wherein the second through hole has a bottom opening that is smaller width than a top opening.

Example 4 may include the apparatus of example 1 and/or some other examples herein, wherein the first through hole or the second through hole has a rectangular cross section with a bottom opening substantially same as a top opening.

Example 5 may include the apparatus of any one of examples 1-3 and/or some other examples herein, wherein a portion of the second dielectric layer is above the first dielectric layer.

Example 6 may include the apparatus of any one of examples 1-3 and/or some other examples herein, wherein the second dielectric layer is coplanar with the first dielectric layer.

Example 7 may include the apparatus of any one of examples 1-3 and/or some other examples herein, wherein the via includes a first via portion and a second via portion within the second dielectric layer, the first via portion is of a first shape, and the second via portion is of a second shape different from the first shape.

Example 8 may include the apparatus of any one of examples 1-3 and/or some other examples herein, wherein the first dielectric material includes a glass-cloth material (GCM) impregnated within a dielectric material.

Example 9 may include the apparatus of example 8 and/or some other examples herein, wherein the GCM has a coefficient of thermal expansion (CTE) in a range of about 8 to about 18.

Example 10 may include the apparatus of example 8 and/or some other examples herein, wherein the first dielectric material includes a glass material, a resin material, and a filler material; and the second dielectric material includes the resin material.

Example 11 may include the apparatus of example 10 and/or some other examples herein, wherein the resin material is a build up resin material.

Example 12 may include the apparatus of example 10 and/or some other examples herein, wherein the resin material includes FR-4-epoxy, polyfunctional FR-4, high temperature one component epoxy system, bismaleimide triazine epoxy (BT), polyimide epoxy, cyanate ester (CE), polyimide, phenol hardener, phenolic ester hardener, or polyimide and polytetrafluoroethylene (PTFE).

Example 13 may include the apparatus of example 10 and/or some other examples herein, wherein the glass material includes a non-woven glass material, a woven glass material, a fiber glass material, or a filled glass material; and the filler material includes silicon dioxide, aluminum oxide, calcium oxide, magnesium oxide, boron trioxide, iron(iii) oxide, or zirconium oxide.

Example 14 may include the apparatus of any one of examples 1-3 and/or some other examples herein, wherein the core layer includes organic resin, inorganic filler, or a conductive material.

Example 15 may include the apparatus of any one of examples 1-3 and/or some other examples herein, wherein the via pad has a width of about 50 um to 150 um, the via has a width of about 10 um to about 100 um, the first dielectric layer has a thickness of about 10 um to 50 um.

Example 16 may include a method for forming a semiconductor device, comprising: forming a via pad at least partially in a core layer; forming a first dielectric layer having a first dielectric material above the via pad and the core layer; forming a first through hole that is through the first dielectric layer to reach the via pad; forming a second dielectric layer having a second dielectric material at least partially filling the first through hole; forming a second through hole that is through the second dielectric layer to reach the via pad; and forming a via within the second through hole of the second dielectric layer, surrounded by the second dielectric material, and in contact with the via pad.

Example 17 may include the method of example 16 and/or some other examples herein, wherein the first through hole has a bottom opening that is smaller than a top opening; or the second through hole has a bottom opening that is smaller than a top opening.

Example 18 may include the method of any one of examples 16-17 and/or some other examples herein, wherein a portion of the second dielectric layer is above the first dielectric layer.

Example 19 may include the method of any one of examples 16-17 and/or some other examples herein, wherein the via includes a first via portion and a second via portion within the second dielectric layer, the first via portion is of a first shape, and the second via portion is of a second shape different from the first shape.

Example 20 may include the method of any one of examples 16-17 and/or some other examples herein, wherein the via includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), and an alloy of Ti, Mo, Au, Pt, Al, Ni, Cu, Cr, TiAlN, HfAlN, or InAlO.

Example 21 may include a computing device, comprising: a semiconductor die; a printed circuit board (PCB); and a package substrate between the semiconductor die and the PCB, wherein the package substrate includes: a via pad at least partially in a core layer; a first dielectric layer having a first dielectric material above the via pad and the core layer, wherein the first dielectric layer has a first through hole that is through the first dielectric layer to reach the via pad; a second dielectric layer having a second dielectric material at least partially filling the first through hole, wherein the second dielectric layer has a second through hole that is through the second dielectric layer to reach the via pad; and a via within the second through hole of the second dielectric layer, surrounded by the second dielectric material, and in contact with the via pad.

Example 22 may include the computing device of example 21 and/or some other examples herein, wherein the first through hole has a bottom opening that is smaller than a top opening; or the second through hole has a bottom opening that is smaller than a top opening.

Example 23 may include the computing device of any one of examples 21-22 and/or some other examples herein, wherein a portion of the second dielectric layer is above the first dielectric layer.

Example 24 may include the computing device of any one of examples 21-22 and/or some other examples herein, wherein the first dielectric material includes a glass-cloth material (GCM) impregnated within a dielectric material, the GCM has a coefficient of thermal expansion (CTE) in a range of about 8 to about 18; the first dielectric material includes a glass material, a resin material, and a filler material; and the second dielectric material includes the resin material.

Example 25 may include the computing device of any one of examples 21-22 and/or some other examples herein, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus, comprising:
   a via pad at least partially in a core layer;
   a first dielectric layer having a first dielectric material above the via pad and the core layer, wherein the first dielectric layer has a first through hole that is through the first dielectric layer to reach the via pad;
   a second dielectric layer having a second dielectric material at least partially filling the first through hole, wherein the second dielectric layer has a second through hole that is through the second dielectric layer to reach the via pad, and wherein the second dielectric layer has an uppermost surface; and
   a via within the second through hole of the second dielectric layer, surrounded by the second dielectric material, and in contact with the via pad, wherein the via has an uppermost surface at a same level as the uppermost surface of the second dielectric layer.

2. The apparatus of claim 1, wherein the first through hole has a bottom opening that is smaller width than a top opening.

3. The apparatus of claim 1, wherein the second through hole has a bottom opening that is smaller width than a top opening.

4. The apparatus of claim 1, wherein the first through hole or the second through hole has a rectangular cross section with a bottom opening substantially same as a top opening.

5. The apparatus of claim 1, wherein a portion of the second dielectric layer is above the first dielectric layer.

6. The apparatus of claim 1, wherein the second dielectric layer is coplanar with the first dielectric layer.

7. The apparatus of claim 1, wherein the via includes a first via portion and a second via portion within the second dielectric layer, the first via portion is of a first shape, and the second via portion is of a second shape different from the first shape.

8. The apparatus of claim 1, wherein the first dielectric material includes a glass-cloth material (GCM) impregnated within a dielectric material.

9. The apparatus of claim 8, wherein the GCM has a coefficient of thermal expansion (CTE) in a range of about 8 to about 18.

10. The apparatus of claim 8, wherein the first dielectric material includes a glass material, a resin material, and a filler material; and
    the second dielectric material includes the resin material.

11. The apparatus of claim 10, wherein the resin material is a build up resin material.

12. The apparatus of claim 10, wherein the resin material includes FR-4-epoxy, polyfunctional FR-4, high temperature one component epoxy system, bismaleimide trizaine epoxy (BT), polyimide epoxy, cyanate ester (CE), polyimide, phenol hardener, phenolic ester hardener, or polyimide and polytetrafluoroethylene (PTFE).

13. The apparatus of claim 10, wherein the glass material includes a non-woven glass material, a woven glass material, a fiber glass material, or a filled glass material; and
    the filler material includes silicon dioxide, aluminum oxide, calcium oxide, magnesium oxide, boron trioxide, iron(iii) oxide, or zirconium oxide.

14. The apparatus of claim 1, wherein the core layer includes organic resin, inorganic filler, or a conductive material.

15. The apparatus of claim 1, wherein the via pad has a width of about 50 um to 150 um, the via has a width of about 10 um to about 100 um, the first dielectric layer has a thickness of about 10 um to 50 um.

16. A computing device, comprising:
    a semiconductor die;
    a printed circuit board (PCB); and
    a package substrate between the semiconductor die and the PCB, wherein the package substrate includes:
      a via pad at least partially in a core layer;
      a first dielectric layer having a first dielectric material above the via pad and the core layer, wherein the first dielectric layer has a first through hole that is through the first dielectric layer to reach the via pad;
      a second dielectric layer having a second dielectric material at least partially filling the first through hole, wherein the second dielectric layer has a second through hole that is through the second dielectric layer to reach the via pad, and wherein the second dielectric layer has an uppermost surface; and
      a via within the second through hole of the second dielectric layer, surrounded by the second dielectric material, and in contact with the via pad, wherein the via has an uppermost surface at a same level as the uppermost surface of the second dielectric layer.

17. The computing device of claim 16, wherein the first through hole has a bottom opening that is smaller than a top opening; or the second through hole has a bottom opening that is smaller than a top opening.

18. The method of claim 17, wherein a portion of the second dielectric layer is above the first dielectric layer.

19. The computing device of claim 16, wherein the first dielectric material includes a glass-cloth material (GCM) impregnated within a dielectric material, the GCM has a coefficient of thermal expansion (CTE) in a range of about 8 to about 18;
the first dielectric material includes a glass material, a resin material, and a filler material; and
the second dielectric material includes the resin material.

20. The computing device of claim 16, wherein the computing device includes a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

21. An apparatus, comprising:
a via pad at least partially in a core layer;
a first dielectric layer having a first dielectric material above the via pad and the core layer, wherein the first dielectric layer has a first through hole that is through the first dielectric layer to reach the via pad, wherein the first dielectric material includes a glass-cloth material (GCM) impregnated within a dielectric material, wherein the first dielectric material includes a glass material, a resin material, and a filler material;
a second dielectric layer having a second dielectric material at least partially filling the first through hole, wherein the second dielectric layer has a second through hole that is through the second dielectric layer to reach the via pad, wherein the second dielectric material includes the resin material; and
a via within the second through hole of the second dielectric layer, surrounded by the second dielectric material, and in contact with the via pad.

22. The apparatus of claim 21, wherein the resin material is a build up resin material.

23. The apparatus of claim 21, wherein the resin material includes FR-4-epoxy, polyfunctional FR-4, high temperature one component epoxy system, bismaleimide trizaine epoxy (BT), polyimide epoxy, cyanate ester (CE), polyimide, phenol hardener, phenolic ester hardener, or polyimide and polytetrafluoroethylene (PTFE).

24. The apparatus of claim 21, wherein the glass material includes a non-woven glass material, a woven glass material, a fiber glass material, or a filled glass material; and
the filler material includes silicon dioxide, aluminum oxide, calcium oxide, magnesium oxide, boron trioxide, iron(iii) oxide, or zirconium oxide.

* * * * *